United States Patent
Chen et al.

(10) Patent No.: US 12,003,218 B2
(45) Date of Patent: Jun. 4, 2024

(54) MIXER WITH FILTERING FUNCTION AND METHOD FOR LINEARIZATION OF MIXER

(71) Applicant: MEDIATEK INC., Hsin-Chu (TW)

(72) Inventors: Tse-Yu Chen, Hsinchu (TW); Chun-Wei Lin, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 17/947,192

(22) Filed: Sep. 19, 2022

(65) Prior Publication Data
US 2023/0107329 A1 Apr. 6, 2023

Related U.S. Application Data

(60) Provisional application No. 63/252,638, filed on Oct. 6, 2021.

(51) Int. Cl.
*H03D 7/14* (2006.01)
*H03F 3/45* (2006.01)

(52) U.S. Cl.
CPC ......... *H03D 7/1491* (2013.01); *H03D 7/1441* (2013.01); *H03F 3/45183* (2013.01)

(58) Field of Classification Search
CPC ...... H03D 7/14; H03D 7/1425; H03D 7/1433; H03D 7/1441; H03D 7/145; H03D 7/1458; H03D 7/1466; H03D 7/1475; H03D 7/1483; H03D 7/1491; H03D 2200/00; H03D 2200/0041; H03D 2200/0066; H03D 2200/0074; H04L 27/02; H04L 27/06; H04L 27/08
See application file for complete search history.

(56) References Cited

U.S. PATENT DOCUMENTS

| | | | |
|---|---|---|---|
| 6,121,818 A | 9/2000 | Kim | |
| 6,763,227 B2* | 7/2004 | Kramer | H04L 25/06 455/67.11 |
| 7,107,025 B2* | 9/2006 | Khorram | H03D 7/1441 330/252 |
| 7,973,587 B2 | 7/2011 | Yang | |
| 8,766,698 B2* | 7/2014 | Wu | H03D 7/1425 327/356 |
| 9,025,709 B2* | 5/2015 | Liao | H03F 3/3028 455/146 |
| 2015/0054584 A1 | 2/2015 | Chang | |

FOREIGN PATENT DOCUMENTS

CN 102332866 A 1/2012

* cited by examiner

*Primary Examiner* — Diana J. Cheng
(74) *Attorney, Agent, or Firm* — Winston Hsu

(57) ABSTRACT

A mixer with a filtering function and a method for linearization of the mixer are provided. The mixer includes at least one amplifier, a transconductance device and a feedback network. The at least one amplifier is configured to output a filtered voltage signal according to an input voltage signal. The transconductance device is coupled to the at least one amplifier, and is configured to generate a filtered current signal according to the filtered voltage signal. The feedback network is coupled between any output terminal among at least one output terminal of the transconductance device and an input terminal of the at least one amplifier. More particularly, the mixer is configured to output a modulated signal according to the filtered current signal.

10 Claims, 2 Drawing Sheets

MIXER WITH FILTERING FUNCTION AND METHOD FOR LINEARIZATION OF MIXER

CROSS REFERENCE TO RELATED APPLICATIONS

This application claims the benefit of U.S. Provisional Application No. 63/252,638, which was filed on Oct. 6, 2021, and is incorporated herein by reference.

BACKGROUND

The present invention is related to mixers of transmitters, and more particularly, a mixer with a filtering function and a method for linearization of the mixer.

For an I/Q modulator within a transmitter, there is a trade-off between linearity requirement and input voltage levels from a previous stage. For example, in order to ensure linearity related performance meets the requirement, the input voltage levels is limited, and signal-to-noise ratio (SNR) related performance is therefore limited. In addition, due to process, voltage and temperature (PVT) variation, large scale simulations may be required to ensure that both of the linearity related performance and the SNR related performance are able to meet the requirements in a mass production phase.

Thus, there is a need for a novel architecture and related method, in order to make the linearity and SNR related performance be more robust under the PVT variation.

SUMMARY

An objective of the present invention is to provide a mixer with a filtering function and a method for linearization of the mixer, which can improve the robustness of the linearity and SNR related performance of the mixer under the PVT variation.

Another objective of the present invention is to provide a mixer with a filtering function and a method for linearization of the mixer, which can solve the problem of the related art without introducing any side effect or in a way that is less likely to introduce side effects.

At least one embodiment of the present invention provides a mixer with a filtering function. The mixer may comprise at least one amplifier, a transconductance device and a feedback network. The at least one amplifier is configured to output a filtered voltage signal according to an input voltage signal. The transconductance device is coupled to the at least one amplifier, and is configured to generate a filtered current signal according to the filtered voltage signal. The feedback network is coupled between any output terminal among at least one output terminal (e.g., one or more output terminals) of the transconductance device and an input terminal of the at least one amplifier. More particularly, the mixer is configured to output a modulated signal according to the filtered current signal.

At least one embodiment of the present invention provides a method for linearization of a mixer. The method may comprise: utilizing at least one amplifier of the mixer to output a filtered voltage signal according to an input voltage signal; utilizing a transconductance device of the mixer to generate a filtered current signal according to the filtered voltage signal; and utilizing a feedback network of the mixer to provide a feedback path from any output terminal among at least one output terminal (e.g., one or more output terminals) of the transconductance device to an input terminal of the at least one amplifier. More particularly, the mixer is configured to output a modulated signal according to the filtered current signal.

Based on the architecture provided by the embodiment of the present invention, a portion of the mixer can be regarded as a filter, where the embodiment makes the transconductance device become a part of a close-loop of the filter, which makes a transfer function between the input voltage signal and the filtered current signal be less likely to be affected by a transconductance of active devices (e.g., transistors), and therefore the linearity of the mixer can be greatly improved. In addition, the embodiment of the present invention will not greatly increase additional costs. Thus, the present invention can solve the problem of the related art without introducing any side effect or in a way that is less likely to introduce side effects.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
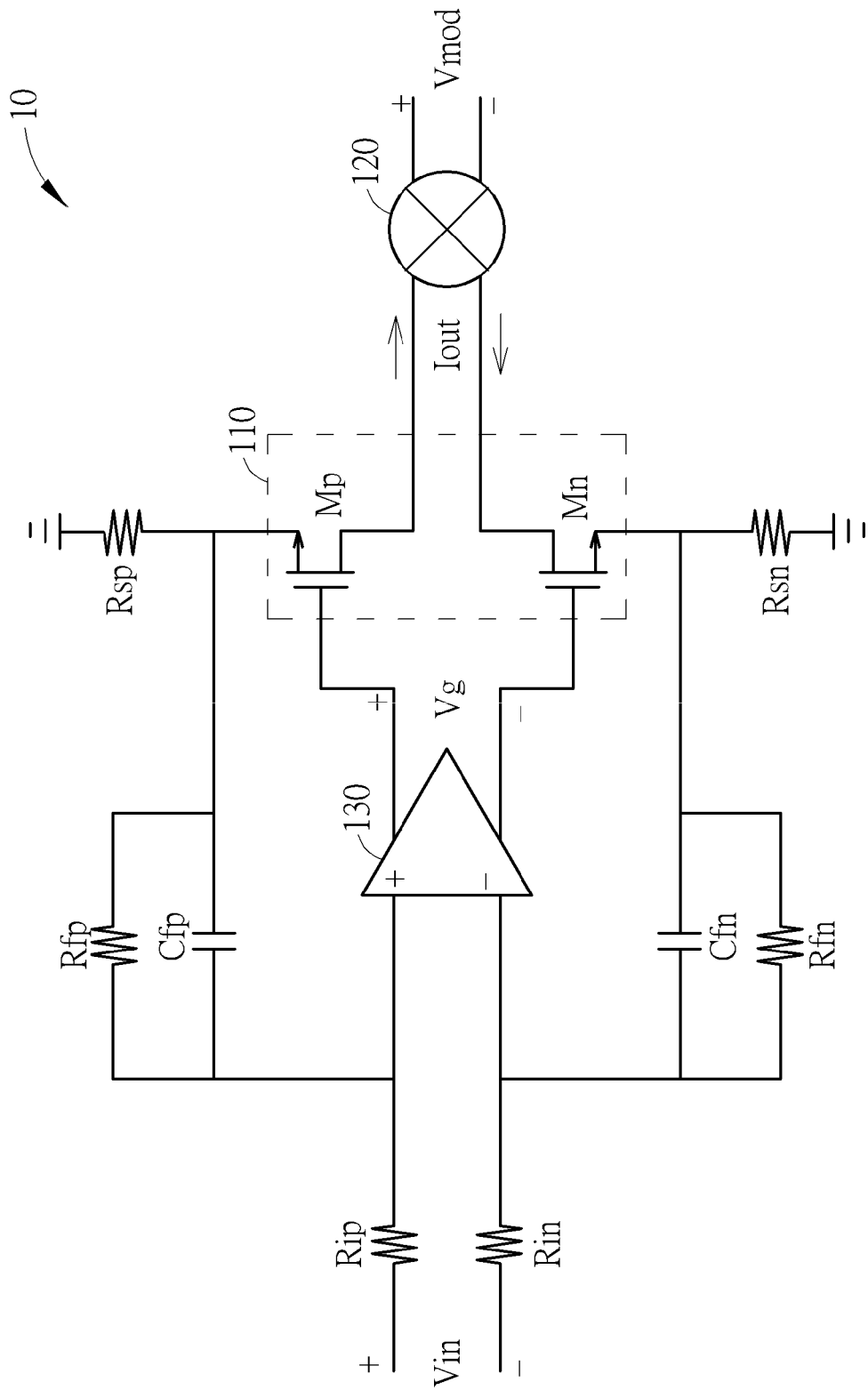
FIG. 1 is a diagram illustrating a mixer with a filtering function according to an embodiment of the present invention.

FIG. 1 is a diagram illustrating a close-loop based mixer 10 with a filtering function according to an embodiment of the present invention. More particularly, the close-loop based mixer 10 may be configured as an I/Q modulator within a transmitter, but the present invention is not limited thereto. As shown in FIG. 1, the close-loop based mixer 10 may comprise a transconductance device 110, a mixer core circuit 120 and at least one amplifier such as an amplifier 130. The amplifier 130 is configured to output a filtered voltage signal Vg according to an input voltage signal Vin. The transconductance device 110 is coupled to the amplifier 130, and is configured to generate a filtered current signal Iout according to the filtered voltage signal Vg. The close-loop based mixer 10 is configured to output a modulated signal Vmod according to the filtered current signal Iout. For example, the mixer core circuit 120 is configured to generate the modulated signal Vmod according to the filtered current signal Iout. In another example, the mixer core circuit 120 is configured to perform up-conversion on the filtered current signal Iout according to a modulation signal, in order to generate an up-converted signal (e.g., the modulated signal Vmod). For example, the mixer core circuit 120 may perform up-conversion on the filtered current signal Iout with the aid of a liquid oscillator (LO) signal, to make a frequency of the modulated signal Vmod be equal to a frequency of the filtered current signal Iout multiplied by a frequency of the LO signal, thereby up-converting the filtered current signal Iout to a radio frequency (RF) band.

In this embodiment, the close-loop based mixer 10 is implemented with a fully differential architecture, where each component of the close-loop based mixer 10 may be implemented in a symmetric manner as shown in FIG. 1. In detail, the transconductance device 110 may comprise a pair of transistors Mp and Mn, where gate terminals of the transistors Mp and Mn are configured to receive the filtered voltage signal Vg, drain terminals of the transistors Mp and Mn are configured to transmit the filtered current signal Iout to the mixer core circuit 120. The close-loop based mixer 10 may further comprise a pair of feedback resistors Rfp and Rfn, a pair of feedback capacitor Cfp and Cfn, a pair of input resistors Rip and Rin, and a pair of source resistors Rsp and Rsn. The input resistors Rip and Rin are coupled to a first input terminal (which is labeled "+" on the amplifier 130 shown in FIG. 1) and a second input terminal (which is labeled "−" on the amplifier 130 shown in FIG. 1) of the amplifier 130, respectively, and are configured to receive the input voltage signal Vin. The source resistor Rsp is coupled between a reference voltage terminal (e.g., a ground terminal) and a source terminal of the transistor Mp, and the source resistor Rsn is coupled between the reference voltage terminal (e.g., the ground terminal) and a source terminal of the transistor Mn.

In this embodiment, the close-loop based mixer 10 may comprise a pair of feedback networks. A first feedback network among the pair of feedback networks is coupled between an output terminal among at least one output terminal of the transconductance device 110 (e.g., the source terminal of the transistor Mp) and the first input terminal of the amplifier 130, where the first feedback network may comprise a first resistor-capacitor (RC) network coupled between the source terminal of the transistor Mp and the first input terminal of the amplifier 130, and the first RC network may comprise the feedback resistor Rfp and the feedback capacitor Cfp connected in parallel between the source terminal of the transistor Mp and the first input terminal of the amplifier 130. A second feedback network among the pair of feedback networks is coupled between another output terminal among the aforementioned at least one output terminal of the transconductance device 110 (e.g., the source terminal of the transistor Mn) and the second input terminal of the amplifier 130, where the second feedback network may comprise a second RC network coupled between the source terminal of the transistor Mn and the second input terminal of the amplifier 130, and the second RC network may comprise the feedback resistor Rfn and the feedback capacitor Cfn connected in parallel between the source terminal of the transistor Mn and the second input terminal of the amplifier 130.

In an alternative design, each of the pair of feedback networks may be coupled between an input terminal and an output terminal of the amplifier 130. The signal on the output terminal of the amplifier 130 may be linear as the signal on the output terminal is fed back to the input terminal of the amplifier 130 via the pair of feedback networks. However, the signal on the output terminal of the transconductance device 110 may be nonlinear, as the transconductance of the transistors Mp and Mn is not a linear parameter. In comparison with the alternative design, the embodiment of FIG. 1 utilizes the pair of feedback networks to feed the signal on the output terminal of the transconductance device 110 (e.g., the voltage signal on the source terminals of the transistors Mp and Mn) back to the input terminal of the amplifier 130, and therefore the signal on the output terminal of the transconductance device 110 (e.g., the voltage signal on the source terminals of the transistors Mp and Mn) can be linear. As a resistance of each of the source resistors Rp and Rn is linear, the filtered current signal Iout which is generated based on the voltage signal on the source terminals of the transistors Mp and Mn and the source resistors Rp and Rn can be linear. As a result, the linearity of the modulated signal Vmod can be improved in comparison with the alternative design mentioned above.

Assume that a resistance of the each of the input resistors Rip and Rin is "Ri", a resistance of each of the source resistors Rsp and Rsn is "Rs", a resistance of each of the feedback resistors Rfp and Rfn is "Rf", and a capacitance of each of the feedback capacitors Cfp and Cfn is "Cf". A transfer function between an input current signal Iin of the close-loop based mixer 10 and the filtered current signal Iout may be expressed as follows:

$$\frac{Iout}{Iin} = \frac{\frac{1}{Rs} + \frac{1}{Rf} + s \times Cf + s \times Cs}{\frac{1}{Rf} + s \times Cf}$$

The parameter "s" may represent a frequency related parameter. The parameter "Cs" may represent a parasitic capacitance on the source terminals of the transistor Mp and Mn. When the parameter "s" is approximately equal to zero (which corresponds to a low frequency response), the transfer function between the input current signal Iin and the filtered current signal Iout may be expressed as follows:

$$\frac{Iout}{Iin} = 1 + \frac{Rf}{Rs}$$

A transfer function between the input voltage signal Vin of the close-loop based mixer 10 and the filtered current signal Iout may be expressed as follows:

$$\frac{Iout}{Vin} = \frac{1}{Ri} + \frac{Rf}{Ri \times Rs}$$

As shown above, the transconductance of each of the transistors Mp and Mn does not affect the transfer function, and the remaining parameters such as "Ri", "Rs" and "Rf" are linear, thereby makes the transfer function linear.

It should be noted that the detailed architecture of the close-loop based mixer 10 shown in FIG. 1 is for illustrative purposes only, and is not meant to be a limitation of the present invention. In some embodiment, the close-loop based mixer 10 may be implemented with a single-ended architecture. In some embodiment, detailed implementation of each of the first feedback network and the second feedback network may vary according to different types of filtering functions. In some embodiment, the close-loop based mixer 10 may comprise multiple stages of amplifiers and associated feedback paths, in order to implement a high order filtering function (e.g., a second order filtering function, a third order filtering function, and so on), where any feedback path associated with the output of the last stage of amplifier can be configured as being coupled between the output terminal of the transconductance device 110 and the input terminal of any of the multiple stages of amplifiers.

In one embodiment, a first portion of the close-loop based mixer 10 (e.g., the portion comprising the input resistors Rip/Rin, the amplifier 130, the transconductance device 110, the source resistors Rsp/Rsn, the feedback resistors Rfp/Rfn and the feedback capacitors Cfp/Cfn) may be regarded as a filter. It should be noted that any type of mixer (which utilizes a transconductance cell as an input stage thereof) can be an example of a second portion of the close-loop based mixer 10 (e.g., the portion comprising the transconductance device 110 and the mixer core circuit 120), but the present invention is not limited thereto. As long as a combined circuit of a filter and a mixer can makes an input stage of this mixer (e.g., a transconductance cell such as the transconductance device 110 shown in FIG. 1) be included in a close-loop of the filter, any alternative design of the combined circuit should belong to the scope of the present invention.

Figure 2:
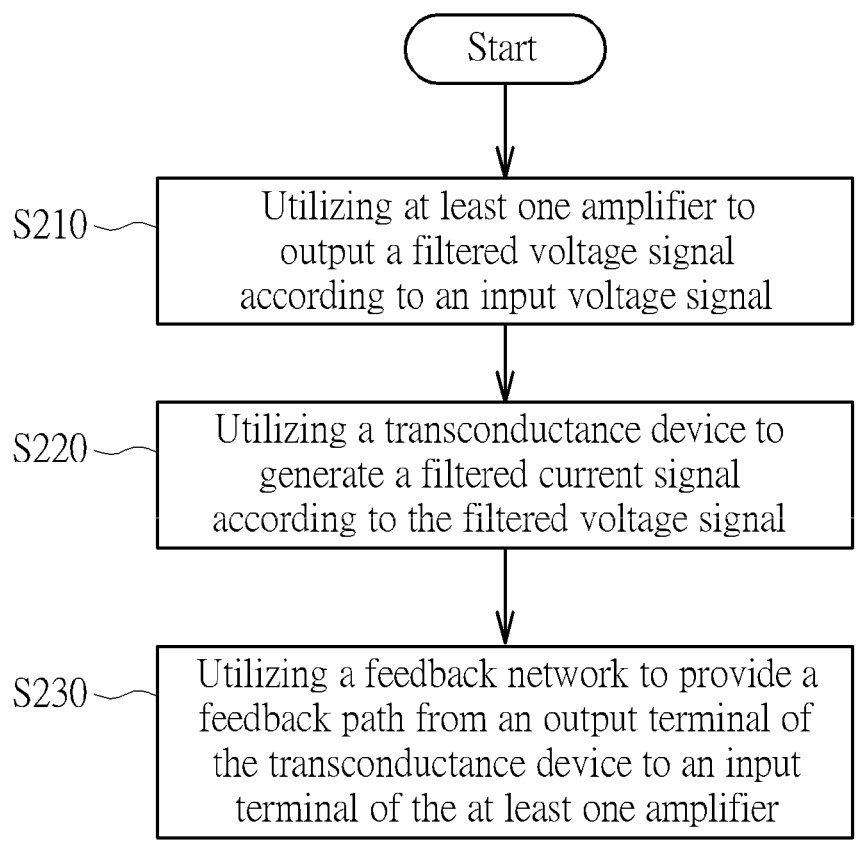
FIG. 2 is a diagram illustrating a working flow of a method for linearization of a mixer according to an embodiment of the present invention.

FIG. 2 is a diagram illustrating a working flow of a method for linearization of a mixer (e.g., the close-loop based mixer 10 shown in FIG. 1) according to an embodiment of the present invention. It should be noted that one or more steps may be added, deleted or modified in the working flow shown in FIG. 2 if a same result can be obtained. In addition, these steps do not having to be executed in the exact order shown in FIG. 2.

In Step S210, the mixer may utilize at least one amplifier thereof to output a filtered voltage signal according to an input voltage signal.

In Step S220, the mixer may utilize a transconductance device thereof to generate a filtered current signal according to the filtered voltage signal.

In Step S230, the mixer may utilize a feedback network thereof to provide a feedback path from an output terminal of the transconductance device to an input terminal of the at least one amplifier.

Briefly summarized, the embodiment of the present invention takes the output of the transconductance device 110 to be the node being connected to the feedback path, rather than takes the output of the amplifier 130 to be the node being connected to the feedback path. The output (e.g., the filtered current signal) of the transconductance device 110 can benefit from a close-loop based architecture, which improves the signal linearity and tolerable signal level. In addition, the embodiment of the present invention will not greatly increase additional costs. Thus, the present invention can solve the problem of the related art without introducing any side effect or in a way that is less likely to introduce side effects.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A mixer with a filtering function, comprising:
    at least one amplifier, configured to output a filtered voltage signal according to an input voltage signal;
    a transconductance device, coupled to the at least one amplifier, configured to receive the filtered voltage from the at least one amplifier and generate a filtered current signal according to the filtered voltage signal, wherein the transconductance device comprises a transistor, and a gate terminal of the transistor is configured to receive the filtered voltage signal; and
    a feedback network, coupled between any output terminal among at least one output terminal of the transconductance device and an input terminal of the at least one amplifier, wherein the feedback network is coupled between a source terminal of the transistor and the input terminal of the at least one amplifier;
    wherein the mixer is configured to output a modulated signal according to the filtered current signal.

2. The mixer of claim 1, further comprising:
    an input resistor, coupled to the input terminal of the at least one amplifier, configured to receive the input voltage signal.

3. The mixer of claim 1, further comprising:
    a source resistor, coupled between a reference voltage terminal and a source terminal of the transistor.

4. A mixer with a filtering function, comprising:
    at least one amplifier, configured to output a filtered voltage signal according to an input voltage signal;
    a transconductance device, coupled to the at least one amplifier, configured to receive the filtered voltage from the at least one amplifier and generate a filtered current signal according to the filtered voltage signal; and
    a feedback network, comprising a resistor-capacitor network, wherein one terminal of the resistor-capacitor network is directly coupled to any output terminal among at least one output terminal of the transconductance device, and another terminal of the resistor-capacitor network is directly coupled to an input terminal of the at least one amplifier;
    wherein the mixer is configured to output a modulated signal according to the filtered current signal.

5. The mixer of claim 4, wherein the resistor-capacitor network comprises a feedback resistor and a feedback capacitor connected in parallel between the any output terminal of the transconductance device and the input terminal of the at least one amplifier.

6. A method for linearization of a mixer, comprising:
    utilizing at least one amplifier of the mixer to output a filtered voltage signal according to an input voltage signal;
    utilizing a transconductance device of the mixer to receive the filtered voltage from the at least one amplifier and generate a filtered current signal according to the filtered voltage signal, wherein the transconductance device comprises a transistor, and a gate terminal of the transistor is configured to receive the filtered voltage signal; and
    utilizing a feedback network of the mixer to provide a feedback path from any output terminal among at least one output terminal of the transconductance device to an input terminal of the at least one amplifier, wherein the feedback network is coupled between a source terminal of the transistor and the input terminal of the at least one amplifier;
    wherein the mixer is configured to output a modulated signal according to the filtered current signal.

7. The method of claim 6, wherein the feedback network comprises a resistor-capacitor network coupled between the any output terminal of the transconductance device and the input terminal of the at least one amplifier.

8. The method of claim 7, wherein the resistor-capacitor network comprises a feedback resistor and a feedback capacitor connected in parallel between the any output terminal of the transconductance device and the input terminal of the at least one amplifier.

9. The method of claim 6, further comprising:
utilizing an input resistor coupled to the input terminal of the at least one amplifier to receive the input voltage signal.

10. The method of claim 6, wherein a source resistor is coupled between a reference voltage terminal and a source terminal of the transistor.

* * * * *